(12) United States Patent
Yamashita

(10) Patent No.: US 8,217,429 B2
(45) Date of Patent: Jul. 10, 2012

(54) SEMICONDUCTOR DEVICE

(75) Inventor: Kyouji Yamashita, Kyoto (JP)

(73) Assignee: Panasonic Corporation, Osaka (JP)

( * ) Notice: Subject to any disclaimer, the term of this patent is extended or adjusted under 35 U.S.C. 154(b) by 255 days.

(21) Appl. No.: 12/689,723

(22) Filed: Jan. 19, 2010

(65) Prior Publication Data
US 2010/0117120 A1 May 13, 2010

Related U.S. Application Data

(63) Continuation of application No. PCT/JP2009/002288, filed on May 25, 2009.

(30) Foreign Application Priority Data

Jul. 9, 2008 (JP) .................................. 2008-178768

(51) Int. Cl.
*H01L 27/092* (2006.01)
(52) U.S. Cl. .................. 257/206; 257/390; 257/E27.062
(58) Field of Classification Search .................. 257/206, 257/390, 369, E27
See application file for complete search history.

(56) References Cited

U.S. PATENT DOCUMENTS

| | | | |
|---|---|---|---|
| 5,420,447 A | 5/1995 | Waggoner | |
| 2007/0196989 A1 | 8/2007 | Kim et al. | |
| 2007/0267680 A1 | 11/2007 | Uchino et al. | |
| 2008/0087966 A1* | 4/2008 | Tai et al. | 257/369 |
| 2011/0147765 A1* | 6/2011 | Huang et al. | 257/77 |

FOREIGN PATENT DOCUMENTS

| | | |
|---|---|---|
| JP | 02-305471 | 12/1990 |
| JP | 04-372168 | 12/1992 |
| JP | 2676406 | 7/1997 |
| JP | 2001-345430 | 12/2001 |
| JP | 2007-214362 | 8/2007 |
| JP | 2007-227565 | 9/2007 |
| JP | 2007-311491 | 11/2007 |
| JP | 2008-047586 | 2/2008 |

OTHER PUBLICATIONS

Tyagi, S., et al., "An advanced low power, high performance, strained channel 65nm technology", International Electron Device Meeting Technical Digest, 2005, pp. 1070-1072, IEEE.

* cited by examiner

*Primary Examiner* — Zandra Smith
*Assistant Examiner* — Paul Patton
(74) *Attorney, Agent, or Firm* — McDermott Will & Emery LLP

(57) ABSTRACT

A semiconductor device includes a first well region 3a; a second well region 3b; a first active region 21a surrounded by an isolation region 2; a second active region 21b surrounded by the isolation regions 2 and 2B; a first MIS transistor MP2 of a second conductivity type formed on the first active region 21a; and including a source/drain region formed of a Si mixed crystal layer buried in a recess; a second MIS transistor MN2 of a first conductivity type formed on the second active region 21b; and an isolation MIS transistor DP2 of the second conductivity type formed on the first active region 21a. The source/drain region of the first MIS transistor is not in contact with the isolation region 2 located at an end of the first active region 21a in a gate length direction.

13 Claims, 7 Drawing Sheets

(a)

(b)

US 8,217,429 B2

SEMICONDUCTOR DEVICE

CROSS-REFERENCE TO RELATED APPLICATION

This is a continuation of PCT International Application PCT/JP2009/002288 filed on May 25, 2009, which claims priority to Japanese Patent Application No. 2008-178768 filed on Jul. 9, 2008. The disclosures of these applications including the specifications, the drawings, and the claims are hereby incorporated by reference in its entirety.

BACKGROUND

The present disclosure relates to layouts of logic cells used for logic LSI circuits, and particularly to layouts of logic cells including MIS transistors, each of which has a source/drain made of Si mixed crystal.

In order to improve performance of CMOS devices, strained Si technology has been introduced, in which tensile/compressive strain is applied to a gate-channel portion to improve mobility of electrons or holes. As known strained Si technology, for example, a contact liner film is formed on a MIS transistor, and tensile strain is applied to a channel from a side surface of a gate electrode to improve the drive capability of the MIS transistor. However, in the technology using a contact liner film, a gate pitch decreases with advancing generations to prevent an increase in thickness of the contact liner film. It is considered that this may lead to difficulty in applying sufficient strain to a channel from a side surface of a gate. Therefore, new technology for improving the drive capability of a MIS transistor is required.

As a type of new technology, more strain is applied to a channel by using a Si mixed crystal layer buried in a substrate as a source/drain region of a MIS transistor. This technology is expected to be promising. In the technology, a silicon germanium (SiGe) layer is used for a source/drain region of a P-channel type MIS transistor (hereinafter referred to as a "P-type MIS transistor"), and a silicon carbide (SiC) layer is used for a source/drain region of an N-channel type MIS transistor (hereinafter referred to as an "N-type MIS transistor") so as to apply strain to a channel, which is a part of a silicon substrate. This technology is described in, for example, IEDM (International Electron Device Meeting) Technical Digest, pp. 1070-1072, 2005.

The following is description of an example of applying to a logic LSI, technology using a Si mixed crystal layer for a source/drain region of a MIS transistor. A logic LSI is conventionally designed by combining hundreds of logic cells, each of which includes a plurality of MIS transistors.

FIGS. 5A and 5B illustrate example circuit structures of a 2 input NAND gate and a 2 input NOR gate, respectively. FIG. 6 is a layout diagram, in which a 2 input NAND gate (on the left side) and a 2 input NOR gate (on the right side) are adjacent to each other in a gate length direction of MIS transistors (i.e., the horizontal direction in the drawing) in a conventional semiconductor device.

FIGS. 7A and 7B are cross-sectional views of the conventional semiconductor device taken along lines VIIa-VIIa, and VIIb-VIIb in FIG. 6.

In this example, as shown in FIG. 6 as well as FIGS. 7A and 7B, an N-type well region 103a, and a P-type well region 103b adjacent to the N-type well region 103a in a gate width direction (i.e., the vertical direction in FIG. 6) are formed on a semiconductor substrate 101 made of silicon. The N-type well region 103a includes an N-type substrate contact region 121e. The N-type substrate contact region 121e is arranged adjacent to active regions 121a and 121b in the gate width direction when viewed from the active regions 121a and 121b, and is coupled to a power source line (or a power source terminal) VDD through a substrate contact. The P-type well region 103b includes a P-type substrate contact region 121f. The P-type substrate contact region 121f is arranged adjacent to active regions 121c and 121d in the gate width direction when viewed from the active regions 121c and 121d, and is coupled to a ground line (or a ground terminal) VSS through a substrate contact. The active regions 121a, 121b, 121c and 121d, the N-type substrate contact region 121e, and the P-type substrate contact region 121f are surrounded by an isolation region 102 having a shallow trench isolation (STI) structure.

P-type MIS transistors MP1 and MP2 constituting the NAND gate are formed in the active region 121a, and P-type MIS transistors MP3 and MP4 constituting the NOR gate are formed in the active region 121b.

N-type MIS transistors MN1 and MN2 constituting the NAND gate are formed in the active region 121c, and N-type MIS transistors MN3 and MN4 constituting the NOR gate are formed in the active region 121d.

Furthermore, a gate line 5G1 including gate electrodes of the P-type MIS transistor MP1 and the N-type MIS transistor MN1, and a gate line 5G2 including gate electrodes of the P-type MIS transistor MP2 and the N-type MIS transistor MN2 are formed to extend from a top of the active region 121a to a top of the active region 121c with a gate insulating film 104 interposed between the gate lines and the active regions. A gate line 5G3 including gate electrodes of the P-type MIS transistor MP3 and the N-type MIS transistor MN3, and a gate line 5G4 including gate electrodes of the P-type MIS transistor MP4 and the N-type MIS transistor MN4 are formed to extend from a top of the active region 121b to a top of the active region 121d with the gate insulating film 104 interposed between the gate lines and the active regions.

As shown in FIG. 7A, each of the P-type MIS transistors MP1, MP2, MP3, and MP4 includes, other than the gate insulating film 104 and the gate electrode; P-type extension regions 106a, P-type source/drain regions 108a, sidewall spacers 107, a silicide layer 109 on the source/drain regions, and a silicide layer 130 on the gate. As shown in FIG. 7B, each of the N-type MIS transistors MN1, MN2, MN3, and MN4 includes, other than the gate insulating film 104 and the gate electrode; N-type extension regions 106b, N-type source/drain regions 108b, sidewall spacers 107, the silicide layer 109 on the source/drain regions, and the silicide layer 130 on the gate. Furthermore, the semiconductor device includes an interlayer insulating film 110 for burying the MIS transistors, contact plugs 111 penetrating the interlayer insulating film 110, and metal wires 112 coupled to the contact plugs 111. Note that, reference characters A1 and B1 in FIG. 6 denote input terminals of the NAND gate, and Y1 denotes an output terminal of the NAND gate. On the other hand, A2 and B2 denote input terminals of the NOR gate, Y2 denotes an output terminal of the NOR gate.

In the conventional semiconductor device, the P-type source/drain regions 108a of the P-type MIS transistors MP1, MP2, MP3, and MP4 are formed of SiGe layers buried in recesses provided in the active regions 121a and 121b. The SiGe layers apply compressive stress to channel regions of the P-type MIS transistors made of silicon to improve mobility of carriers.

Furthermore, the P-type MIS transistors MP1 and MP4, which are adjacent to each other, are electrically separated by an isolation region 102A. Each of the P-type MIS transistors MP2 and MP3 is electrically separated from a P-type MIS transistor (not shown) by the isolation region 102.

When forming the P-type source/drain regions 108a, the isolation regions 102 and 102A, the gate lines 105G1, 105G2, 105G3, and 105G4, the P-type extension regions 106a, and the sidewall spacers 107 are formed at first. Then, the active regions 121a and 121b are etched to form recesses in side regions of the gate lines 105G1, 105G2, 105G3, and 105G4. Then, the SiGe layers containing P-type impurities are selectively epitaxially grown within the recesses to form the P-type source/drain regions 108a.

SUMMARY

However, when using conventional technology, as shown in FIG. 7A, defective formation of the SiGe layers may occur in portions of the P-type source/drain regions 108a, which are in contact with the isolation regions 102 and 102A. The SiGe layers are formed by epitaxial growth using chemical vapor deposition (CVD) or the like. Thus, the SiGe layers are well grown on silicon within the recesses, but not from side surfaces of the isolation regions 102 and 102A formed of silicon oxide films. This causes the above-described defective formation to reduce thickness of the SiGe layers in the portions of the P-type source/drain regions 108a, which are in contact with the isolation regions 102 and 102A. As a result, there is a problem that a current flowing a P-type MIS transistor may easily leak after the formation of the silicide layer 109 on the source/drain regions.

While FIGS. 7A and 7B illustrate the case where the P-type source/drain regions 108a formed of SiGe layers are provided in a P-type MIS transistor, defective formation of N-type source/drain regions may also easily occur as in the above-described example, when the N-type source/drain regions formed of SiC layers are provided in an N-type MIS transistor in order to improve channel mobility.

In view of these disadvantages, the semiconductor device according to the embodiments of the present invention can improve channel mobility and reliability of a MIS transistor, in which a Si mixed crystal layer is used for a source/drain region while reducing leakage current.

An example semiconductor device according to the present invention includes: a first well region of a first conductivity type formed in a semiconductor substrate; a first active region surrounded by an isolation region formed in the first well region, and formed of the semiconductor substrate; a first MIS transistor of a second conductivity type including a first gate electrode formed on the first active region, and a first source/drain region of the second conductivity type formed of a first Si mixed crystal layer buried in a recess provided in a region of the first active region under a side of the first gate electrode; and a first isolation gate electrode provided on the first active region, in a gate length direction when viewed from the first gate electrode with the first Si mixed crystal layer interposed therebetween. The first source/drain region is not in contact with the isolation region located at an end of the first active region in the gate length direction.

In this structure, stress is applied to the channel from the Si mixed crystal layer to improve electron or hole mobility of the first MIS transistor, and the first source/drain region of the first MIS transistor is not in contact with the isolation region to reduce defective formation of the Si mixed crystal layer in the first source/drain region. Thus, leakage current can be reduced, and improvement in reliability and performance of the MIS transistor can be achieved at the same time. In addition, the overall circuit area can be reduced more than in the case where both of the first MIS transistor and the second MIS transistor are electrically separated by an isolation MIS transistor.

As the Si mixed crystal layer, a SiGe layer is used when the first MIS transistor is of a P-channel type, and a SiC layer is used when the first MIS transistor is of an N-channel type. Thus, the electron or hole mobility of the MIS transistor can be effectively improved, since compressive stress or tensile stress is appropriately applied to the channel.

In the semiconductor device according to an example of the present invention, stress is applied to the channel from the Si mixed crystal layer to improve the electron or hole mobility of the first MIS transistor, and the first source/drain region of the first MIS transistor is not in contact with the isolation region to reduce defective formation of the Si mixed crystal layer in the first source/drain region. Therefore, leakage current can be reduced, and improvement in reliability and performance of the MIS transistor can be achieved at the same time. That is, defective formation of the Si mixed crystal layer forming the source/drain region of the MIS transistor is less likely to occur, and improvement in reliability and performance can be achieved at the same time.

The semiconductor device according to the present invention contributes to improvement in performance of MIS transistors constituting, for example, a logic cell, and is used for various types of LSIs.

DETAILED DESCRIPTION

The present inventor studied various structures to address disadvantages, which occur when a source/drain region of a MIS transistor is formed of a Si mixed crystal layer. As a result, he found that employing a structure of electrically separating adjacent MIS transistors by a gate isolation system is effective to reduce defective formation of the Si mixed crystal layer. After further studies, the present inventor found that it is most preferable to use a source/drain region formed of a Si mixed crystal layer for only one of a P-channel type MIS transistor (hereinafter referred to as a "P-type MIS transistor") and an N-channel MIS transistor (hereinafter referred to as an "N-type MIS transistor"), and to apply a gate isolation structure between MIS transistors using Si mixed crystal layers. The wording "gate isolation system" as used here refers to an isolation system, in which a MIS transistor controlled to be normally off is provided between two adjacent transistors to electrically separate the two transistors. Hereinafter, embodiments of the present invention are described using examples of logic cells.

First Embodiment

Figure 1:
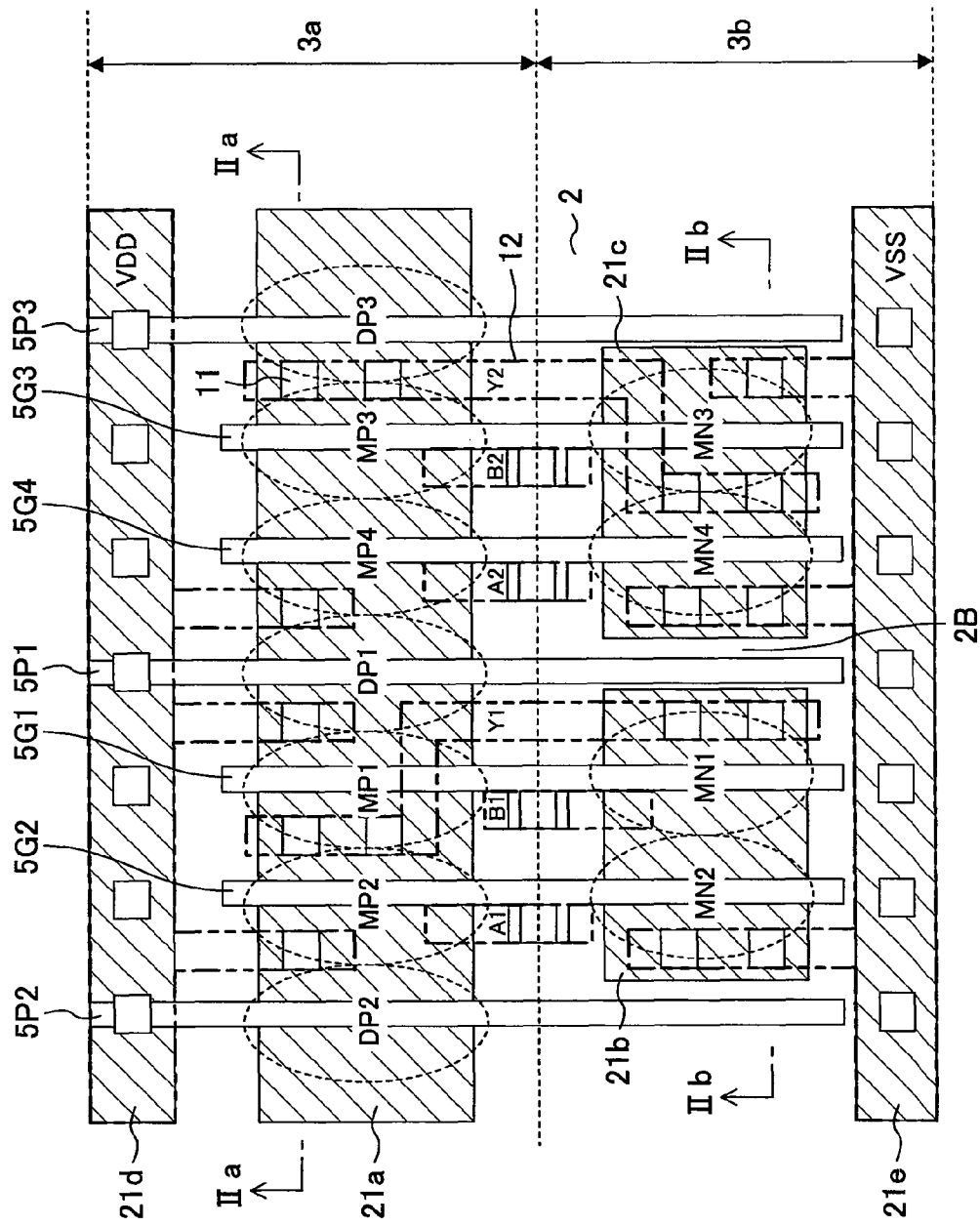
FIG. 1 is a layout diagram of a logic cell, in which a 2 input NAND gate (on the left side) and a 2 input NOR gate (on the right side) are adjacent to each other in a gate length direction of MIS transistors (i.e., the horizontal direction in the drawing) in a semiconductor device according to a first embodiment of the present invention.
Figure 2:
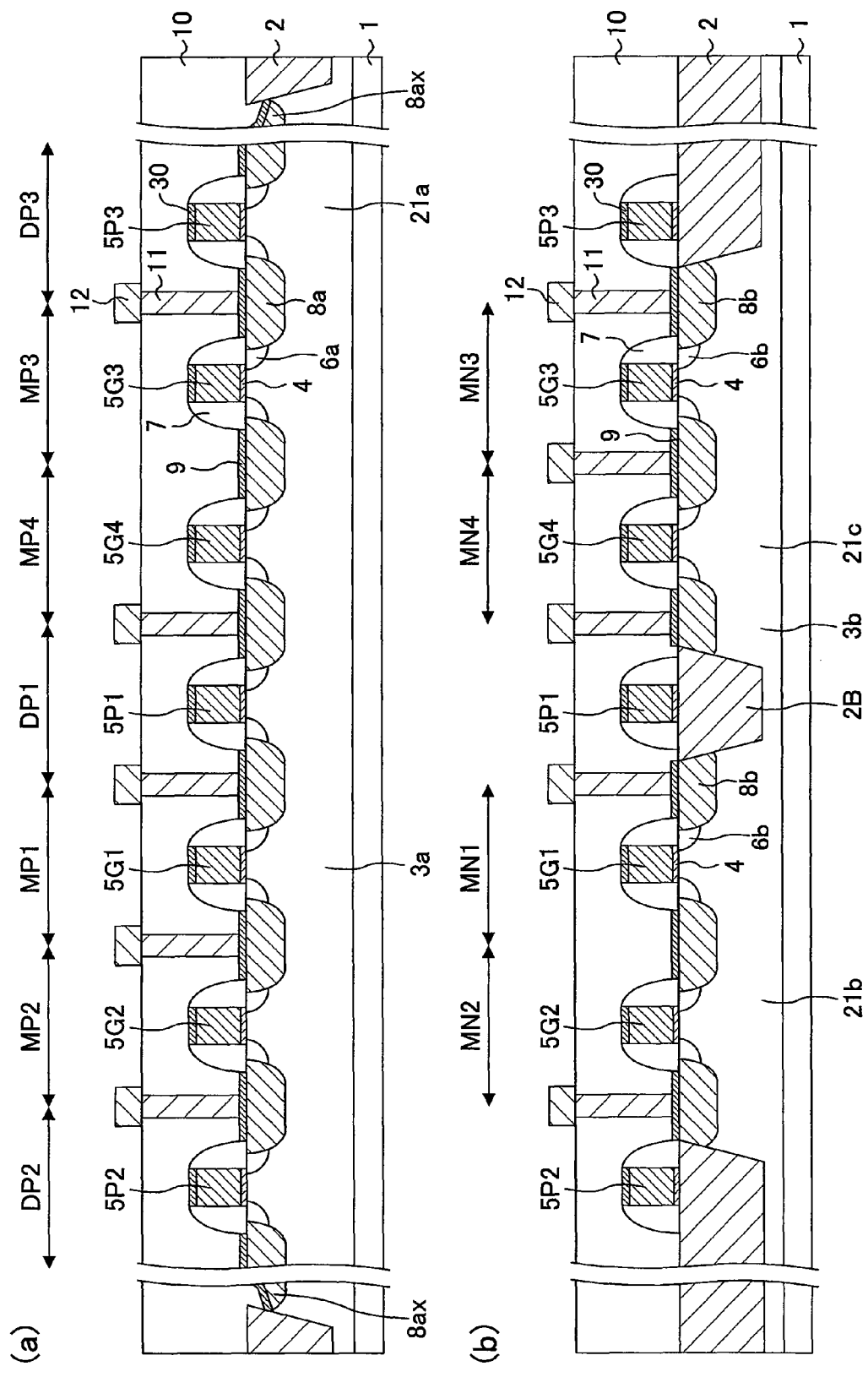
FIGS. 2A and 2B are cross-sectional views of the semiconductor device according to the first embodiment taken along lines IIa-IIa, and IIb-IIb in FIG. 1, respectively.
Figure 5:
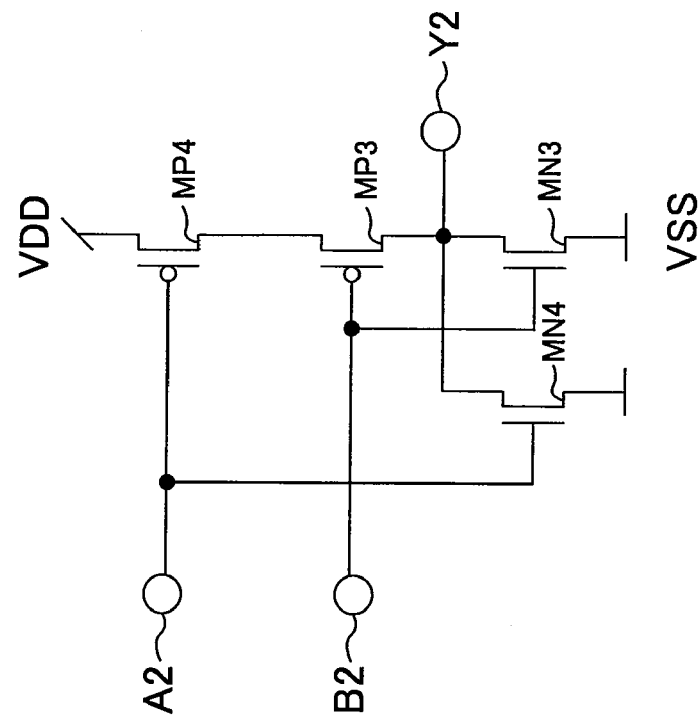
FIGS. 5A and 5B illustrate example circuit structures of a 2 input NAND gate and a 2 input NOR gate, respectively.
Figure 5:
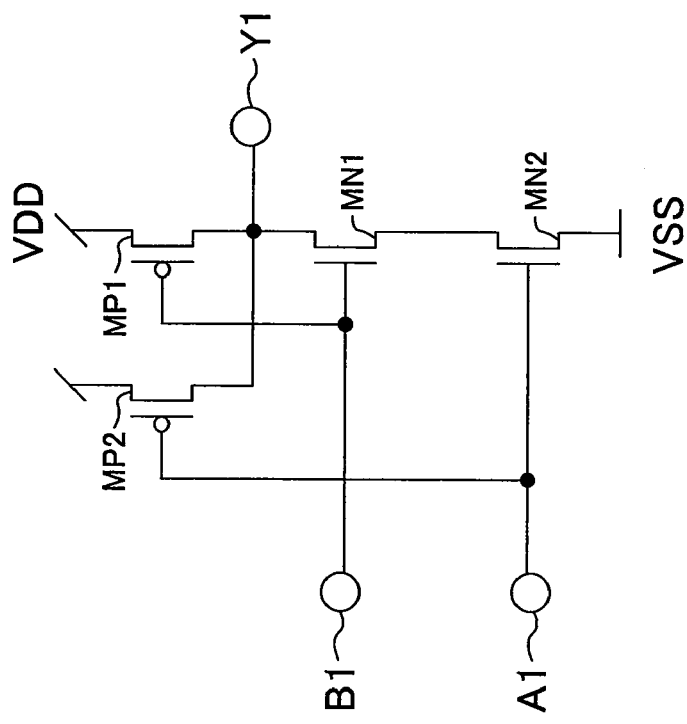

FIG. 1 is a layout diagram of a logic cell, in which a 2 input NAND gate (on the left side) and a 2 input NOR gate (on the right side) are adjacent to each other in a gate length direction of MIS transistors (i.e., the horizontal direction in the drawing) in a semiconductor device according to a first embodiment of the present invention. FIGS. 2A and 2B are cross-sectional views of the semiconductor device according to the first embodiment taken along lines IIa-IIa, and IIb-IIb in FIG. 1, respectively. The circuit structures of the 2 input NAND gate and the 2 input NOR gate are as shown in FIGS. 5A and 5B, respectively.

In the semiconductor device according to this embodiment, an N-type well region 3a, and a P-type well region 3b adjacent to the N-type well region 3a in a gate width direction (i.e., the vertical direction in FIG. 1) are formed on a semiconductor substrate 1 made of silicon.

The N-type well region 3a includes an active region 21a surrounded by an isolation region 2 having an STI structure, and an N-type substrate contact region 21d. The N-type substrate contact region 21d is arranged in the gate width direction when viewed from the active region 21a with the isolation region 2 interposed therebetween, and is coupled to a power source line (or a power source terminal) VDD through a substrate contact. The N-type substrate contact region 21d is surrounded by the isolation region 2 and arranged on the opposite side of the P-type well region 3b when viewed from the active region 21a.

The P-type well region 3b includes an active region 21b and an active region 21c, which are surrounded by the isolation region 2, and a P-type substrate contact region 21e. The P-type substrate contact region 21e is arranged in the gate width direction when viewed from the active regions 21b and 21c with the isolation region 2 interposed therebetween, and is coupled to a ground line (or a ground terminal) VSS through a substrate contact. The active region 21c is arranged in the gate length direction when viewed from the active region 21b with the isolation region 2 interposed therebetween. The P-type substrate contact region 21e is surrounded by the isolation region 2, and arranged on the opposite side of the N-type well region 3a when viewed from the active regions 21b and 21c. That is, the active regions 21a, 21b, and 21c are formed between the N-type substrate contact region 21d and the P-type substrate contact region 21e.

The active region 21a and the active regions 21b and 21c are arranged with the interface of the N-type well region 3a and the P-type well region 3b interposed therebetween, and electrically separated from each other by the isolation region 2. In FIG. 1 as well as FIGS. 2A and 2B, a portion of the isolation region 2, which is provided between the below-described N-type MIS transistor MN1 and N-type MIS transistor MN4, is particularly represented by an "isolation region 2B."

Furthermore, P-type MIS transistors MP1 and MP2 constituting the NAND gate, and P-type MIS transistors MP3 and MP4 constituting the NOR gate are formed in the active region 21a. The N-type MIS transistors MN1 and MN2 constituting the NAND gate are formed in the active region 21b, and N-type MIS transistors MN3 and MN4 constituting the NOR gate are formed in the active region 21c.

Furthermore, as illustrated by the gate pattern of FIG. 1, a gate line 5G1 including gate electrodes of the P-type MIS transistor MP1 and the N-type MIS transistor MN1, and a gate line 5G2 including gate electrodes of the P-type MIS transistor MP2 and the N-type MIS transistor MN2 are formed to extend from a top of the active region 21a to a top of the active region 21b with a gate insulating film 4 interposed between the gate lines and the active regions. A gate line 5G3 including gate electrodes of the P-type MIS transistor MP3 and the N-type MIS transistor MN3, and a gate line 5G4 including gate electrodes of the P-type MIS transistor MP4 and the N-type MIS transistor MN4 are formed to extend from the top of the active region 21a to a top of the active region 21c with the gate insulating film 4 interposed between the gate lines and the active regions.

Each of the P-type MIS transistors MP1, MP2, MP3, and MP4 includes, as shown in FIG. 2A, other than the gate insulating film 4 and the gate electrode; P-type extension regions 6a, P-type source/drain regions 8a, sidewall spacers 7, a silicide layer 9 on the source/drain regions, and a silicide layer 30 on the gate. On the other hand, each of the N-type MIS transistors MN1, MN2, MN3, and MN4 includes, as shown in FIG. 2B, other than the gate insulating film 4 and the gate electrode, N-type extension regions 6b, N-type source/drain regions 8b, sidewall spacers 7, the silicide layer 9 on the source/drain regions, and the silicide layer 30 on the gate. Furthermore, the semiconductor device includes an interlayer insulating film 10 for burying the MIS transistors, contact plugs 11 penetrating the interlayer insulating film 10, and metal wires 12 coupled to the contact plugs 11. Note that, reference characters A1 and B1 in FIG. 1 denote input terminals of the NAND gate, and Y1 denotes an output terminal of the NAND gate. A2 and B2 denote input terminals of the NOR gate, and Y2 denotes an output terminal of the NOR gate.

In the semiconductor device according to this embodiment, the two P-type MIS transistors MP1 and MP4, which are adjacent to each other in the gate length direction, are electrically separated by a P-type isolation MIS transistor DP1. The two N-type MIS transistors MN1 and MN4, which are adjacent to each other in the gate length direction, are electrically separated by the isolation region 2B. P-type isolation MIS transistors DP2 and DP3 are provided between the P-type MIS transistor MP2 and the isolation region 2, and between the P-type MIS transistor MP3 and the isolation region 2, respectively.

Furthermore, an isolation gate line 5P1 including an isolation gate electrode of the P-type isolation MIS transistor DP1, an isolation gate line 5P2 including an isolation gate electrode of the P-type isolation MIS transistor DP2, and an isolation gate line 5P3 including an isolation gate electrode of the P-type isolation MIS transistor DP3 extend straight to a top of the N-type substrate contact region 21d over the active region 21a; and are coupled to the power source line VDD through the substrate contact. Thus, each of the P-type isolation MIS transistors DP1, DP2, and DP3 is kept in an off state during operation of the semiconductor device. Therefore, the isolation gate electrodes of the P-type isolation MIS transistors DP1, DP2, and DP3, the N-type substrate contact region 21d, and the N-type well region 3a are coupled to the power source line VDD to the same electrical potential.

In this embodiment, the isolation gate line 5P1 extends straight to a top of the isolation region 2B located between the active region 21b and the active region 21c. As such, by aligning an end of the isolation gate line 5P1 with ends of the gate lines 5G1, 5G2, 5G3, and 5G4, variation in the shapes when forming the gate lines can be reduced. Ends of the isolation gate lines 5P2 and 5P3 are also aligned with the ends of the gate line 5G1, 5G2, 5G3, and 5G4, like the isolation gate line 5P1.

Furthermore, in the semiconductor device according to this embodiment, the P-type source/drain regions 8a of the P-type MIS transistors MP1, MP2, MP3, and MP4 are formed of SiGe layers epitaxially grown to fill recesses provided in the active region 21a. On the other hand, the N-type source/drain regions 8b of the N-type MIS transistors MN1, MN2, MN3, and MN4, which are electrically separated by the isolation regions 2 and 2B, are formed by ion-implantation into the active regions 21b and 21c made of silicon.

In the above-described structure, the P-type source/drain regions 8a of the P-type MIS transistors MP1, MP2, MP3, and MP4 constituting the logic cell are prevented from coming into contact with the isolation region 2 located at an end of the active region 21a in the gate length direction. Thus, defective formation of the SiGe layers forming the P-type source/drain regions 8a is less likely to occur. Possible defective formation is that, in the P-type source/drain regions 8ax of the P-type isolation MIS transistors DP2 and DP3, which are in contact with the isolation region 2 located at ends of the active region 21a in the gate length direction; the SiGe layers have more dented upper surfaces than the SiGe layers in the P-type source/drain regions 8a. However, no or little leakage current is generated, since no (or little if any) current flows through the P-type source/drain regions 8ax of the P-type isolation MIS transistors DP2 and DP3, which are in contact with the isolation region 2. Therefore, in the semiconductor device according to this embodiment, compressive stress is applied from the SiGe layers to channel regions in the gate length direction, to improve the channel mobility of the P-type MIS transistors. Furthermore, leakage current in the P-type MIS transistors can be reduced. This enables improvement in performance and reliability of the semiconductor device at the same time.

Figure 6:
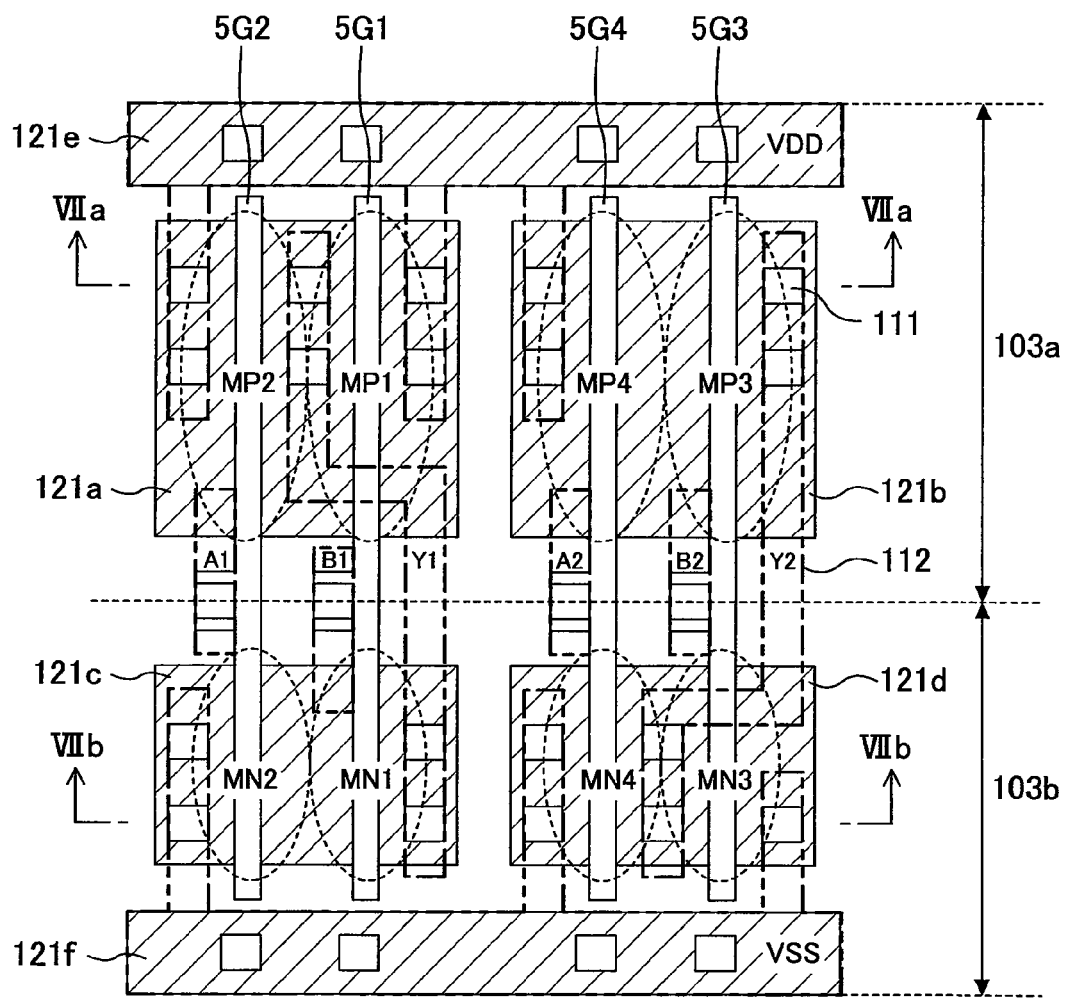
FIG. 6 is a layout diagram of a logic cell, in which a 2 input NAND gate (on the left side) and a 2 input NOR gate (on the right side) are adjacent to each other in a gate length direction of MIS transistors (i.e., the horizontal direction in the drawing) in a conventional semiconductor device.
Figure 7:
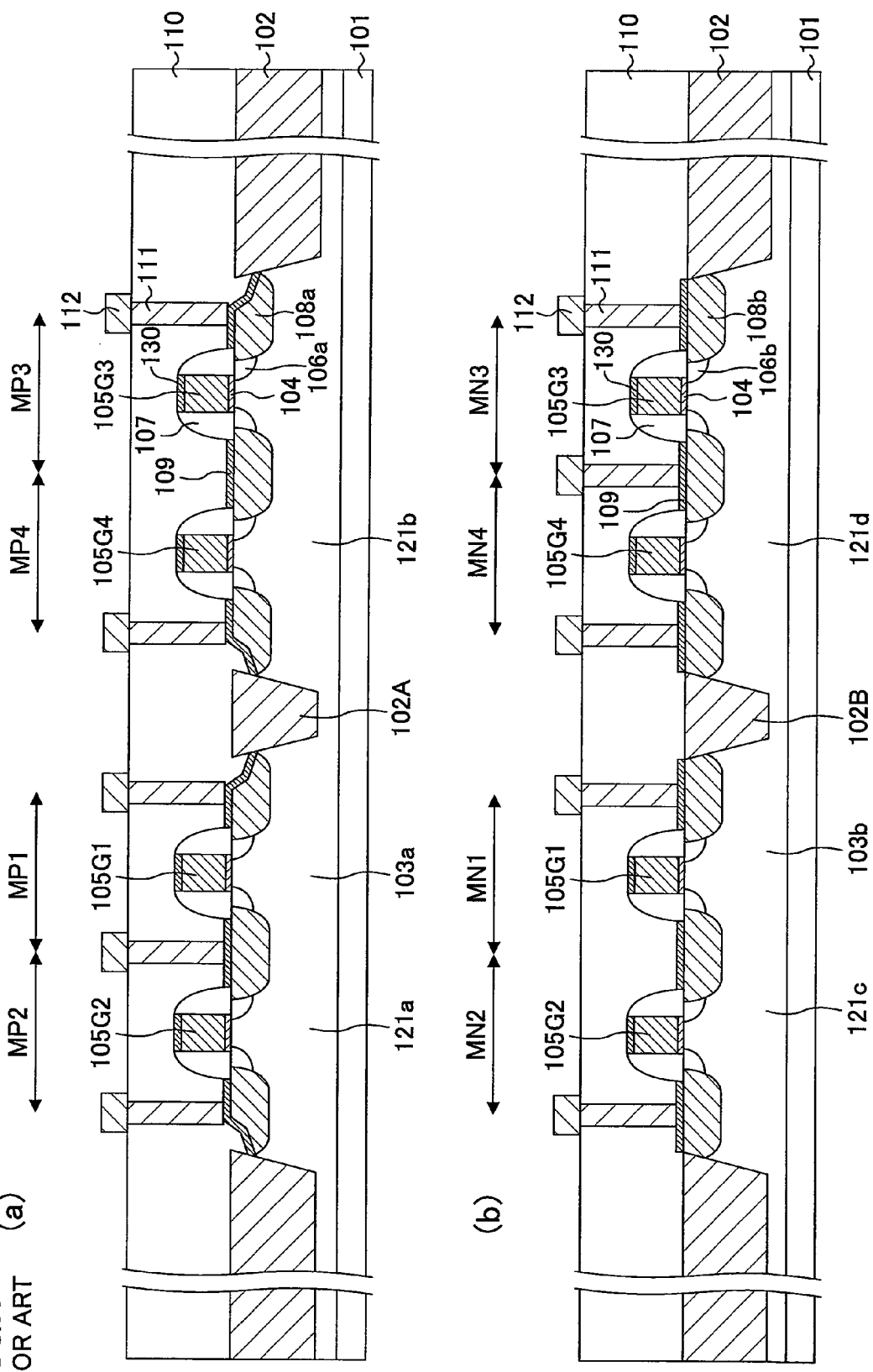
FIGS. 7A and 7B are cross-sectional views of the conventional semiconductor device taken along lines VIIa-VIIa, and VIIb-VIIb in FIG. 6, respectively.

Furthermore, in the structure of the semiconductor device according to this embodiment, only the P-type MIS transistors are electrically separated by the P-type isolation MIS transistors. Thus, the overall area of the logic cell can be reduced more than in the case where the P-type MIS transistors and the N-type MIS transistors are both electrically separated by isolation MIS transistors. If the P-type MIS transistors and the N-type MIS transistors are separated by the isolation MIS transistors, the isolation gate lines of the N-type isolation transistors and the isolation gate lines of the P-type isolation transistors need to be formed in U shapes. This increases the size of the logic cell in the gate length direction, thereby drastically increase the overall circuit area. By contrast, in the semiconductor device according to this embodiment, the distance between the active region 21a and the N-type substrate contact region 21d, and the distance between gate extension portions of the gate lines 5G1, 5G2, 5G3, and 5G4 (i.e., the projecting portions from the active region 21a in the gate width direction) and the N-type substrate contact region 21d need to be formed larger than in the conventional example shown in FIG. 6. On the other hand, stress applied from the SiGe layers improves drive capabilities of the P-type MIS transistors to reduce the gate width. Therefore, according to the semiconductor device of this embodiment, the area of the logic cell can be reduced more than in a conventional semiconductor device.

While this embodiment shows an example of applying the present invention to the logic cell including a 2 input NAND gate and a 2 input NOR gate, performance and reliability of the semiconductor device can be improved at the same time even when applying a similar structure to a conventional logic cell including a logic gate other than the 2 input NAND gate and the 2 input NOR gate. The structure of the present invention can be applied not only to a logic cell but also to a circuit including P-type MIS transistors and N-type MIS transistors.

Furthermore, in an actual semiconductor integrated circuit, a plurality of logic cells are arranged, and thus, the P-type isolation MIS transistors DP2 and DP3, which are located at both ends of the gate length direction, are arranged between adjacent logic cells. In this case, one of the P-type source/drain regions 8a of the P-type isolation MIS transistors DP2 and DP3 may be in contact with the isolation region 2 (see FIGS. 1 and 2A), and the P-type isolation MIS transistors DP2 and DP3 may be arranged without any isolation region 2 interposed between the P-type isolation MIS transistors DP2 and DP3 and respective adjacent logic cells.

Hereinafter, method of manufacturing the semiconductor device according to this embodiment is briefly described with reference to FIGS. 2A and 2B.

First, with the use of known technology, the N-type well region 3a and the P-type well region 3b, which are adjacent to each other, are formed at desired positions in the semiconductor substrate 1. Then, the isolation regions 2 and 2B are formed at desired regions in the N-type well region 3a and the P-type well region 3b. As a result, the active regions 21a, 21b, and 21c surrounded by the isolation regions 2 and 2B are formed. Next, after forming by a known method, the gate insulating film 4 formed of e.g., a silicon oxide film in the active regions 21a, 21b and 21c, gate lines (5G1-5G4 and 5P1-5P3) made of e.g., polysilicon are formed on the gate insulating film 4 and the isolation regions 2 and 2B. At this time, one ends of the isolation gate lines 5P1, 5P2, and 5P3 of the isolation P-type MIS transistors are formed to extend to the region in which the N-type substrate contact region 21d will be formed. Then, ion-implantation is performed using the gate lines as masks to selectively form the P-type extension regions 6a in regions of the active region 21a, which are located on both sides of the gate lines. On the other hand, the N-type extension regions 6b of the active regions 21b and 21c, which are located on both sides of the gate lines, are selectively formed.

Then, after forming the sidewall spacers 7 made of e.g., SiN on side surfaces of each of the gate lines, the regions of the active region 21a, which are located outside the gate lines and the sidewall spacers 7, are etched to form recesses, with a top of the P-type well region 3b including the active regions 21b and 21c covered with a mask. The depth of the recesses is about 50-70 nm, and portions directly under the sidewall spacers 7 are etched about 20-30 nm.

Next, the P-type SiGe layers are epitaxially grown in the recesses formed in the active region 21a to form the P-type source/drain regions 8a including the P-type SiGe layers buried in the recesses. At this time, CVD is utilized with the use of silane ($SiH_4$) or dichlorosilane ($SiH_2Cl_2$; DCS) as Si precursor, and germane ($GeH_4$) as Ge precursor. Furthermore, P-type impurities contained in the P-type source/drain regions 8a is in-situ doped during the growth of the SiGe layers.

Then, with the top of the N-type well region 3a including the active region 21a covered with a mask, N-type impurities are ion implanted into regions of the active regions 21b and 21c, which are located outside the gate lines and the sidewall spacers 7 to form the N-type source/drain regions 8b. Note that the P-type source/drain regions 8a and the N-type source/drain regions 8b may be formed in any order.

Finally, by a known method, the silicide layer 9 on the source/drain, the silicide layer 30 on the gate, the interlayer insulating film 10, the contact plugs 11, the metal wires 12 are formed, thereby manufacturing the semiconductor device according to this embodiment.

Second Embodiment

Figure 3:
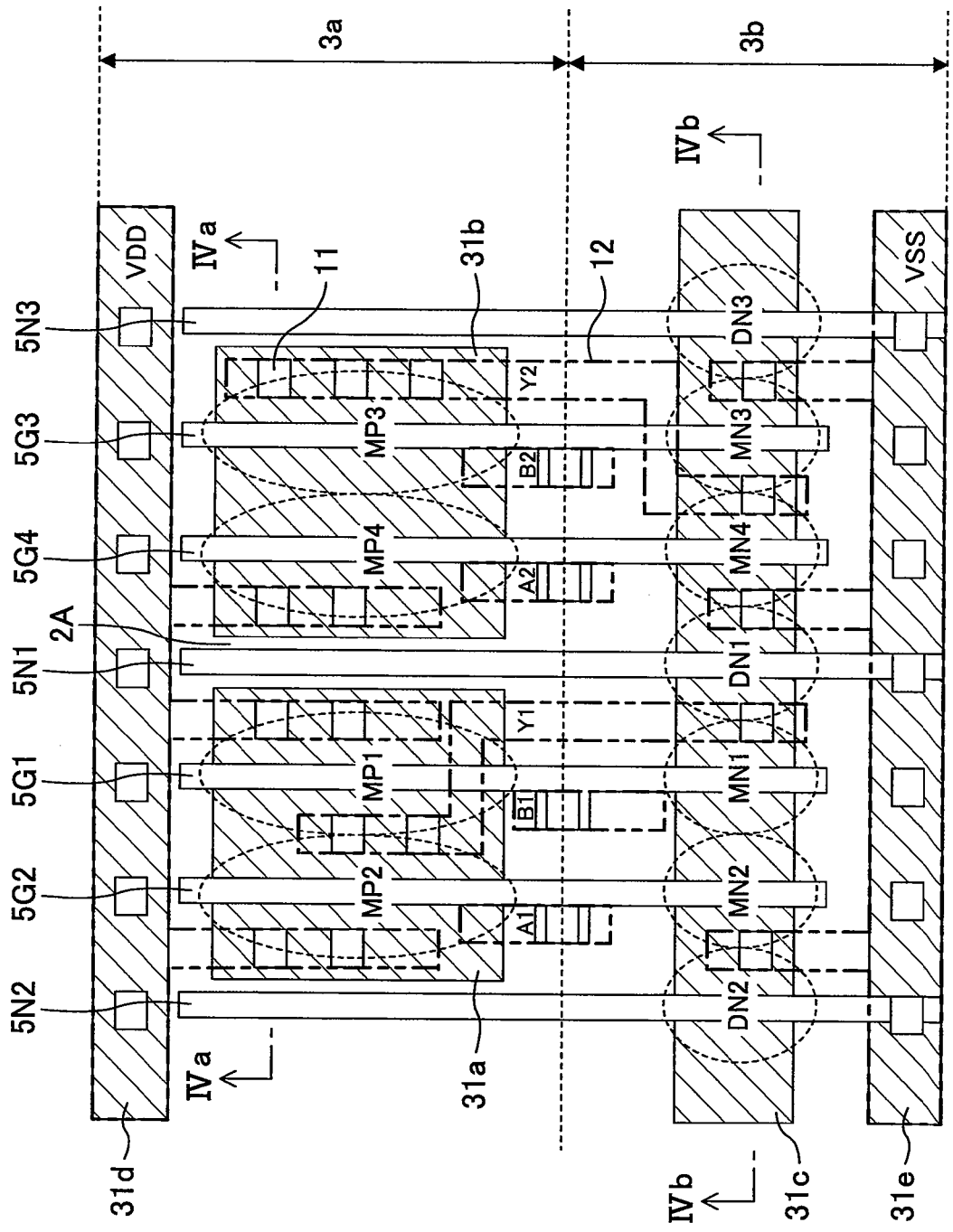
FIG. 3 is a layout diagram of a logic cell, in which a 2 input NAND gate (on the left side) and a 2 input NOR gate (on the right side) are adjacent to each other in a gate length direction of MIS transistors (i.e., the horizontal direction in the drawing) in a semiconductor device according to a second embodiment of the present invention.
Figure 4:
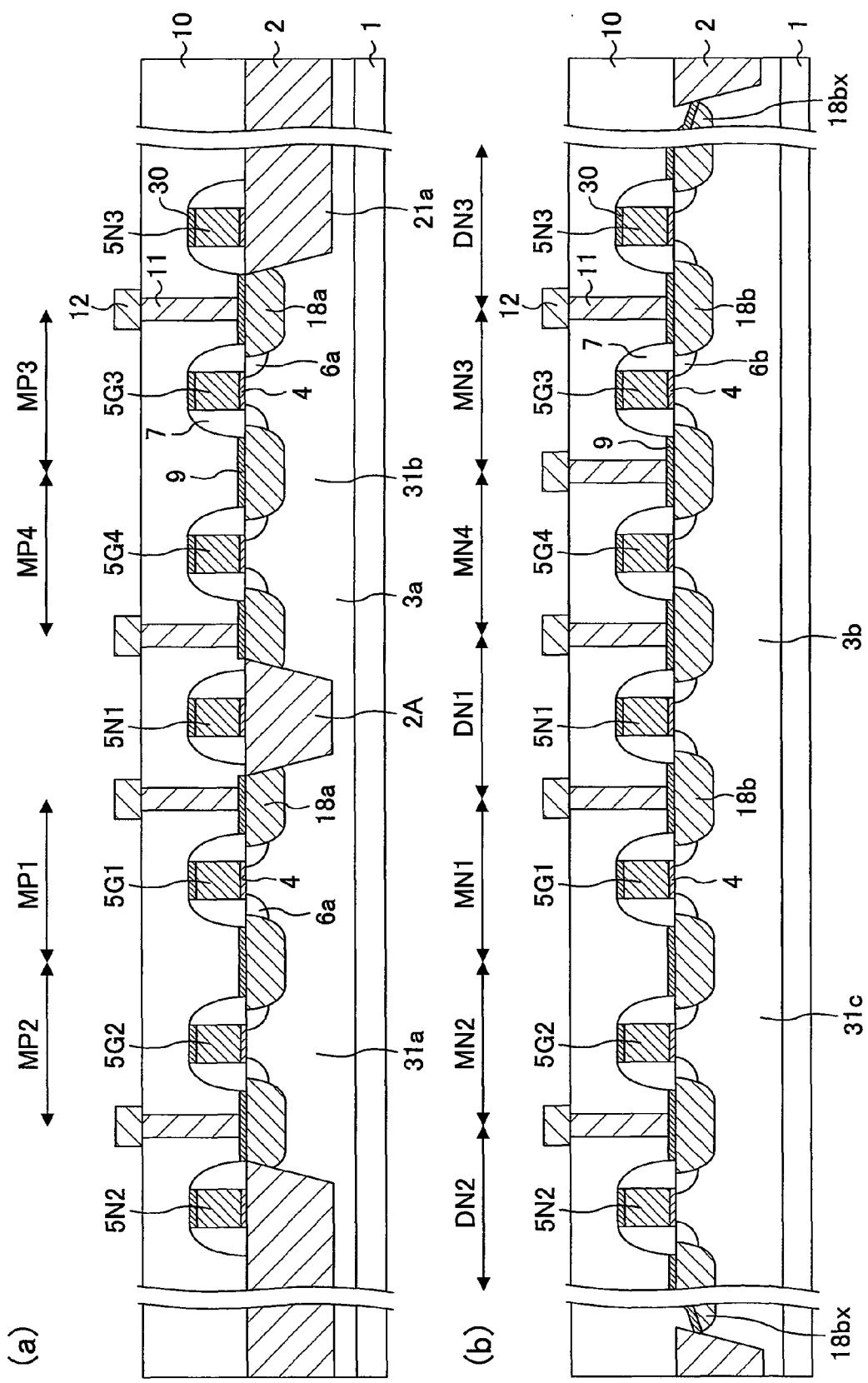
FIGS. 4A and 4B are cross-sectional views of the semiconductor device according to the second embodiment taken along lines IVa-IVa, and IVb-IVb in FIG. 3, respectively.

FIG. 3 is a layout diagram of a logic cell, in which a 2 input NAND gate (on the left side) and a 2 input NOR gate (on the right side) are adjacent to each other in a gate length direction of MIS transistors (i.e., the horizontal direction in the drawing) in a semiconductor device according to a second embodiment of the present invention. FIGS. 4A and 4B are cross-sectional views of the semiconductor device according to the second embodiment taken along lines IVa-IVa, and IVb-IVb in FIG. 3, respectively.

In the semiconductor device according to this embodiment, the N-type source/drain regions of the N-type MIS transistors are formed of SiC layers, and the gate isolation system is used to electrically separate two adjacent N-type MIS transistors. In the following description, like reference characters indicate like components, and explanation thereof is omitted or simplified.

In the semiconductor device according to this embodiment, the N-type well region 3a includes an active region 31a and an active region 31b, which are surrounded by an isolation region 2, and an N-type substrate contact region 31d. The N-type substrate contact region 31d is arranged in the gate width direction when viewed from the active regions 31a and 31b with the isolation region 2 interposed therebetween, and is coupled to a power source line (or a power source terminal) VDD through a substrate contact. The active region 31b is arranged in the gate length direction when viewed from an active region 31c with the isolation region 2 interposed therebetween. The N-type substrate contact region 31d is surrounded by the isolation region 2 and arranged on the opposite side of the P-type well region 3b when viewed from the active regions 31a and 31b.

The P-type well region 3b includes the active region 31c surrounded by the isolation region 2, and a P-type substrate contact region 31e arranged in the gate width direction when viewed from the active region 31e with the isolation region 2 interposed therebetween. The P-type substrate contact region 31e is coupled to a ground line (or a ground terminal) VSS through a substrate contact. The P-type substrate contact region 31e is surrounded by the isolation region 2, and arranged on the opposite side of the N-type well region 3a when viewed from the active region 31c. That is, the active regions 31a, 31b, and 31c are located between the N-type substrate contact region 31d and the P-type substrate contact region 31e.

The active regions 31a and 31b and the active region 31c are arranged with the interface of the N-type well region 3a and the P-type well region 3b interposed therebetween, and electrically separated from each other by the isolation region 2. In FIG. 3 as well as FIGS. 4A and 4B, a portion of the isolation region 2, which is provided between P-type MIS transistors MP1 and MP4, is particularly represented by an "isolation region 2A."

In the semiconductor device according to this embodiment, as shown in FIG. 3 as well as FIGS. 4A and 4B, the P-type MIS transistors MP1 and MP4, which are adjacent to each other in the gate length direction, are electrically separated by the isolation region 2A. N-type MIS transistors MN1 and MN4, which are adjacent to each other in the gate length direction, are electrically separated by an N-type isolation MIS transistor DN1. Furthermore, N-type isolation MIS transistors DN2 and DN3 are provided between an N-type MIS transistor MN2 and the isolation region 2, and an N-type MIS transistor MN3 and the isolation region 2, respectively.

Furthermore, an isolation gate line 5N1 including an isolation gate electrode of the N-type isolation MIS transistor DN1, an isolation gate line 5N2 including an isolation gate electrode of the N-type isolation MIS transistor DN2, and an isolation gate line 5N3 including an isolation gate electrode of the N-type isolation MIS transistor DN3, extend straight to a top of the P-type substrate contact region 31e over at least the active region 31c, and are coupled to the ground line VSS through the substrate contact. Thus, each of the N-type isolation MIS transistors DN1, DN2, and DN3 is kept in an off state during operation of the semiconductor device. Therefore, the isolation gate electrodes of the N-type isolation MIS transistors DN1, DN2, and DN3, the P-type substrate contact region 31e, and the P-type well region 3b are coupled to the ground line VSS to the same electrical potential.

In this embodiment, the isolation gate line 5N1 extends straight to a top of the isolation region 2A located between the active region 31a and the active region 31b. As such, by aligning an end of the isolation gate line 5N1 with ends of the gate lines 5G1, 5G2, 5G3, and 5G4, variation in the shapes when forming the gate lines can be reduced.

Furthermore, in the semiconductor device according to this embodiment, N-type source/drain regions 18b of the N-type MIS transistors MN1, MN2, MN3, and MN4 are formed of SiC layers epitaxially grown to fill recesses provided in the active region 31c. On the other hand, P-type source/drain regions 18a of the P-type MIS transistors, which are electrically separated by the isolation regions 2 and 2A, are formed by ion-implantation to the active regions 31a and 31b made of silicon.

In the above-described structure, the N-type source/drain regions 18b of the N-type MIS transistors MN1, MN2, MN3, and MN4 constituting the logic cell are prevented from coming into contact with the isolation region 2 located at an end of the active region 21b in the gate length direction. Thus, defective formation of the SiC layers forming the N-type source/drain regions 18b of the N-type MIS transistors MN1, MN2, MN3, and MN4 is less likely to occur. Possible defective formation is that, in the N-type source/drain regions 18bx of the N-type isolation MIS transistors DN2 and DN3, which are in contact with the isolation region 2 located at ends of the active region 21b in the gate length direction; the SiC layers has more dented upper surfaces than the SiGe layers in the N-type source/drain regions 18b. However, no or little leakage current is generated, since no (or little if any) current flows through the N-type source/drain regions 18bx of the N-type isolation MIS transistors DN2 and DN3, which are in contact with the isolation region 2. Therefore, in the semiconductor device according to this embodiment, tensile stress is applied from the SiC layers to channel regions in the gate length direction, to improve the channel mobility of the N-type MIS transistors. Furthermore, leakage current in the N-type MIS transistors can be reduced. This enables improvement in performance and reliability of the semiconductor device at the same time.

Furthermore, in the structure of the semiconductor device according to this embodiment, only the N-type MIS transistors are electrically separated by the N-type isolation MIS transistors. Thus, the overall area for the logic cell can be reduced than in the case where the P-type MIS transistors and the N-type MIS transistors are both electrically separated by isolation MIS transistors.

While this embodiment shows an example of applying the present invention to the logic cell including a 2 input NAND gate and a 2 input NOR gate, performance and reliability of the semiconductor device can be improved at the same time even when applying a similar structure to a conventional logic cell including a logic gate other than the 2 input NAND gate and the 2 input NOR gate.

Furthermore, in the semiconductor device according to this embodiment, one of the N-type source/drain regions 18b of the N-type isolation MIS transistors DN2 and DN3 may be in contact with the isolation region 2 (see FIGS. 3 and 4B), and the N-type isolation MIS transistors DN2 and DN3 may be arranged without any isolation region 2 interposed between the N-type isolation MIS transistors DN2 and DN3 and respective adjacent logic cells.

What is claimed is:

1. A semiconductor device comprising:
   a first well region of a first conductivity type formed in a semiconductor substrate;
   a first active region surrounded by an isolation region formed in the first well region, and formed of the semiconductor substrate;
   a first MIS transistor of a second conductivity type including a first gate electrode formed on the first active region, and a first source/drain region of the second conductivity type formed of a first Si mixed crystal layer buried in a recess provided in a region of the first active region under a side of the first gate electrode; and
   a first isolation gate electrode provided on the first active region, in a gate length direction when viewed from the first gate electrode with the first Si mixed crystal layer interposed therebetween, wherein
   the first source/drain region is not in contact with the isolation region located at an end of the first active region in the gate length direction.

2. The semiconductor device of claim 1, wherein
   the first isolation gate electrode is electrically coupled to the first well region, thereby allowing the first isolation gate electrode to be at substantially a same electrical potential as the first well region.

3. The semiconductor device of claim 1, wherein
   the first Si mixed crystal layer is formed in a region of the first active region under one side of the first isolation gate electrode, and
   a second Si mixed crystal layer, which is buried in a recess provided in the first active region and is in contact with the isolation region located at an end of the first active region in the gate length direction, is formed in a region of the first active region under the other side of the first isolation gate electrode.

4. The semiconductor device of claim 3, further comprising a contact plug coupled onto the first Si mixed crystal layer through a silicide layer, wherein
   the contact plug is not formed on the second Si mixed crystal layer.

5. The semiconductor device of claim 3, wherein
   an end of the second Si mixed crystal layer, which is in contact with the isolation region in the gate length direction has more dented upper surface than an end of the second Si mixed crystal layer, which is located under the other side of the first isolation gate electrode in the gate length direction.

6. The semiconductor device of claim 1, wherein
   the first MIS transistor is of a P-channel type, and
   the first Si mixed crystal layer is made of SiGe.

7. The semiconductor device of claim 6, wherein
   the first isolation gate electrode is coupled to a power source line.

8. The semiconductor device of claim 1, wherein
   the first MIS transistor is of an N-channel type, and
   the first Si mixed crystal layer is made of SiC.

9. The semiconductor device of claim 8, wherein
   the first isolation gate electrode is coupled to a ground line.

10. The semiconductor device of claim 1 further comprising a first substrate contact region of the first conductivity type provided in the first well region in a gate width direction when viewed from the first active region with the isolation region interposed therebetween, wherein
    a first isolation gate line including the first isolation gate electrode extends to a top of the first substrate contact region over at least the first active region, and is electrically coupled to the first substrate contact region, thereby allowing the first isolation gate line to be at substantially a same electrical potential as the first substrate contact region.

11. The semiconductor device of claim 1, further comprising:
    a second well region of the second conductivity type formed in the semiconductor substrate, and being adjacent to the first well region in a gate width direction;
    a second active region formed in the second well region and formed of the semiconductor substrate surrounded by an isolation region; and
    a second MIS transistor of the first conductivity type including a second gate electrode formed on the second active region, and a second source/drain region of the first conductivity type in a region of the second active region under a side of the second gate electrode.

12. The semiconductor device of claim 11,
    the second source/drain region is in contact with the isolation region located at an end of the second active region in the gate length direction.

13. The semiconductor device of claim 1, further comprising:
    a third MIS transistor of the second conductivity type including a third gate electrode formed on the first active region, and a third source/drain region of the second conductivity type formed of the first Si mixed crystal layer buried in a recess provided in a region of the first active region under a side of the third gate electrode; and
    a second isolation gate electrode formed in a region of the first active region between the first source/drain region and the third source/drain region, and electrically coupled to the first well region, thereby allowing the second isolation gate electrode to be at substantially a same electrical potential as the first well region.

* * * * *